US010283358B2

United States Patent
Chu et al.

(10) Patent No.: US 10,283,358 B2
(45) Date of Patent: May 7, 2019

(54) LATERAL GAN PN JUNCTION DIODE ENABLED BY SIDEWALL REGROWTH

(71) Applicant: HRL Laboratories, LLC, Malibu, CA (US)

(72) Inventors: Rongming Chu, Agoura Hills, CA (US); Yu Cao, Agoura Hills, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 15/980,554

(22) Filed: May 15, 2018

(65) Prior Publication Data

US 2018/0337042 A1    Nov. 22, 2018

Related U.S. Application Data

(60) Provisional application No. 62/508,356, filed on May 18, 2017.

(51) Int. Cl.
| | |
|---|---|
| *H01L 29/12* | (2006.01) |
| *H01L 21/02* | (2006.01) |
| *H01L 29/20* | (2006.01) |
| *H01L 29/861* | (2006.01) |
| *H01L 29/66* | (2006.01) |
| *H01L 29/06* | (2006.01) |

(52) U.S. Cl.
CPC .... *H01L 21/02636* (2013.01); *H01L 21/0254* (2013.01); *H01L 21/02389* (2013.01); *H01L 29/0649* (2013.01); *H01L 29/2003* (2013.01); *H01L 29/66136* (2013.01); *H01L 29/8611* (2013.01)

(58) Field of Classification Search
CPC ............ H01L 29/2003; H01L 21/0254; H01L 29/0649; H01L 29/66136; H01L 29/8611; H01L 21/02389; H01L 21/02636
USPC .......................................................... 257/613
See application file for complete search history.

(56) References Cited

U.S. PATENT DOCUMENTS

| | | | | |
|---|---|---|---|---|
| 9,224,860 B2 * | 12/2015 | Kagawa | ............... | H01L 29/7811 |
| 9,559,012 B1 * | 1/2017 | Chu | ................... | H01L 29/2003 |
| 9,741,797 B2 * | 8/2017 | Kagawa | ............ | H01L 29/66068 |

(Continued)

OTHER PUBLICATIONS

Hu, Z., et al., "Near unity ideality factor and Shockley-Read-Hall lifetime in GaN-on-GaN p-n diodes with avalanche breakdown," Applied Physics Letters 107, 243501 (2015), (5 pages).

(Continued)

*Primary Examiner* — Luan C Thai
(74) *Attorney, Agent, or Firm* — Ladas & Parry

(57) ABSTRACT

Lateral PN junctions and diodes and transistors comprising lateral PN junctions and methods used in making such devices are disclosed. A method of fabricating a lateral PN junction, can comprise: conformally growing p–GaN material on a n–GaN vertical surface extending vertically from an n–GaN horizontal surface on an n–GaN drift layer to form a first PN junction, wherein the n–GaN horizontal surface extends horizontally from the n–GaN vertical surface and the n–GaN horizontal surface has a layer of dielectric material formed on the n–GaN horizontal surface that extends from the p–GaN surface.

14 Claims, 10 Drawing Sheets

(56) References Cited

U.S. PATENT DOCUMENTS 9,825,164 B2 * 11/2017 Kagawa ............ H01L 29/66068

OTHER PUBLICATIONS

I. C. Kizilyalli, et al., "Vertical Power p-n Diodes Based on Bulk GaN," IEEE Transactions on Electron Devices, vol. 62, No. 2, Feb. 2015, pp. 414-422.
Zhang, Y., et al., "GaN-on-Si Vertical Schottky and p-n Diodes," IEEE Electron Device Letters, vol. 35, No. 6, Jun. 2014, pp. 618-620.

* cited by examiner

LATERAL GAN PN JUNCTION DIODE ENABLED BY SIDEWALL REGROWTH

CROSS REFERENCE TO RELATED APPLICATIONS

This non-provisional application claims priority to provisional application No. 62/508,356 filed on May 18, 2017.

TECHNICAL FIELD

The present disclosure is directed in general to diodes, transistors and other semiconductor devices.

BACKGROUND OF THE DISCLOSURE

Junctions, such as PN junctions can be used in various devices such as diodes and transistors. PN junctions have a p-doped region of a semiconductor adjacent to an n-doped region of a semiconductor. As a diode, PN junctions can stop the flow of current in one direction while allowing flow in the opposite direction. In some transistors, two PN junctions can be used to amplify a signal.

In various embodiments, as disclosed herein GaN PN diodes can be fabricated with a vertical structure on GaN substrates, a lateral structure on insulating substrates, or in other orientations, and the PN junction in can be placed in the c-plane or in other planes.

SUMMARY OF THE DISCLOSURE

In a first aspect, a method of fabricating a lateral PN junction is provided. The method comprising: conformally growing p-GaN material on a n-GaN vertical surface extending vertically from an n-GaN horizontal surface to form a first PN junction, wherein the n-GaN horizontal surface extends horizontally from the n-GaN vertical surface and the n-GaN horizontal surface has a layer of dielectric material formed on the n-GaN horizontal surface that extends from the p-GaN surface.

In a second aspect, a method of fabricating a lateral PN junction is provided. The method comprising: isotropically depositing a first layer of dielectric material on a n-GaN drift layer; patterning and etching the n-GaN drift layer to form a trench through the first layer of dielectric material and into the n-GaN drift layer, wherein the trench comprises a bottom surface and a first sidewall; anisotropically depositing a second layer of dielectric material on the bottom surface of the trench and on the first layer of dielectric material; isotropically etching the trench resulting in n-GaN drift layer having remaining first layer and second layer of dielectric material on an upper horizontal surface of the n-GaN drift layer and remaining second layer of dielectric material on the bottom surface of the trench and the first sidewall having exposed n-GaN material; conformally regrowing p-GaN material on the exposed n-GaN material of the first sidewall.

In a third aspect, a semiconductor comprising a lateral PN junction is provided, the semiconductor comprising: an n-GaN horizontal surface; an n-GaN vertical surface extending vertically from the n-GaN horizontal surface; a dielectric layer deposited on the n-GaN horizontal surface and contacting the n-GaN vertical surface; and a p-GaN layer extending horizontally from the n-GaN vertical surface to form a first PN junction therewith.

DETAILED DESCRIPTION

Figure 1A:
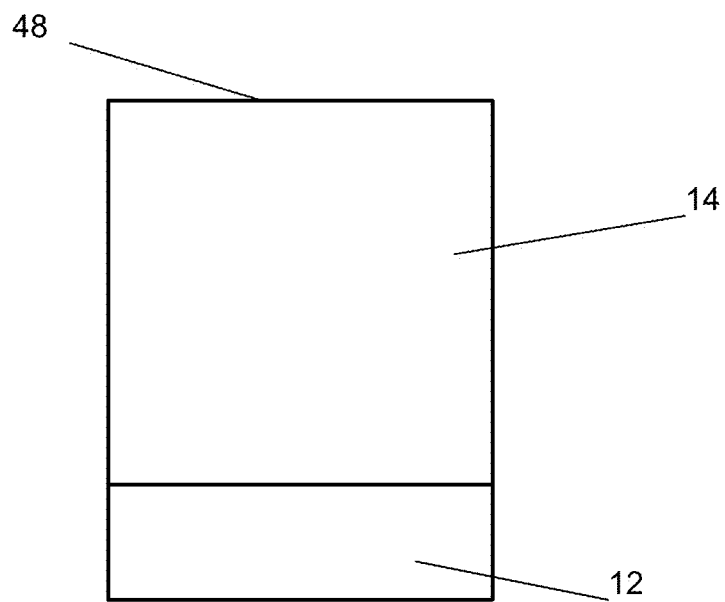
FIGS. 1a-g show processing steps of an embodiment disclosed herein.

It should be understood at the outset that, although example embodiments are illustrated below, the present technology may be implemented using any number of techniques, whether currently known or not. The present technology should in no way be limited to the example implementations, drawings, and techniques illustrated below. Additionally, the drawings are not to scale, except when indicated otherwise by, for example, context.

As discussed herein, "vertical" means extending in a direction outward from or perpendicular to a substrate non-edge surface and "horizontal" (whether contacting or not) means parallel to a substrate non-edge surface. In some discussion, the designation of horizontal and vertical can be made in terms of the orientation defined prior to removal of a substrate, and in some cases, the material or surface being described as "horizontal" or "vertical" can be added after the removal of the substrate.

PN junctions and PN diodes can be fabricated from a variety of semiconductors doped with appropriate dopants. Preferably, PN junctions can be fabricated from doped GaN or other suitable Group III-Group V semiconductors. Dopants for the Group III-Group V semiconductor can include silicon or oxygen or other suitable elements to produce an n-type semiconductor or magnesium or other suitable elements to produce a p-type semiconductor.

In various embodiments, GaN PN junctions and diodes can be fabricated with a vertical structure, such as where a P-doped GaN material is positioned above or below an N-doped GaN material, on GaN substrates, or a lateral structure, such as where a P-doped GaN material is positioned horizontally in relation to an N-doped GaN material, on insulating substrates. In some embodiments, the PN junction can be placed in the c-plane, however the PN junction can also in some embodiments be placed in another plane, such as the m-plane, the r-plane or the a-plane.

Preferable PN junctions and PN diodes can be fabricated as a lateral device, where the p-doped portion is located to one side of (e.g., displaced horizontally or horizontally and vertically from) the n-doped portion, rather than in a vertical arrangement of one on top of the other. Such lateral devices can be used for making GaN vertical device structures, such as GaN junction barrier Schottky (JBS) diodes and GaN Superjunction (SJ) MOSFETs.

In some embodiments of fabricating a lateral PN junction or PN diode, planar (horizontal) surfaces can be masked while vertical surfaces, such as trench sidewalls, stepped features or other surfaces having vertical relief, can be exposed for regrowth of semiconductor material. In various embodiments, the semiconductor material can be a form of GaN or other Group III-Group V semiconductor or semiconductor alloy system such as BN, BP, BAs, $B_{12}As_2$, AlN, AlP, AlAs, AlSb, GaP, GaAs, GaSb, In N, InP, InAs, InSb, $Al_xGa_{1-x}As$, $In_xGa_{1-x}As$, $In_xGa_{1-x}P$, $Al_xIn_{1-x}As$, $Al_xIn_{1-x}Sb$, GaAsN, GaAsP, GaAsSb, AlGaN, AlGaP, InGaN, InAsSb, AlGaInP, AlGaAsP, InGaAsSb, InAsSbP, AlInAsP, AlGaAsN, InGaAsN, InAlAsN, GaAsSbN, BaInNAsSb, BaInAsSbP, etc. and combinations thereof. The semiconductor material can be doped, such as to produce an "n" form or a "p" form, such as n–GaN or p–GaN. In some embodiments, the regrowth can regrow a "p" form such as p–GaN and the exposed surface can be an "n" form, such as n–GaN, producing a PN junction. In some embodiments, the regrowth can regrow an "n" form such as n–GaN and the exposed surface can be a "p" form, such as p–GaN, producing a PN junction. In some embodiments of regrowing semiconductor material to form a PN junction, vertical growth originating from the planar (horizontal) surface below and adjacent to the vertical surface (such as a trench bottom or a bottom of a step feature) can be prevented or limited so as to reduce or eliminate dislocations generated by competitive growth on the vertical and horizontal planes.

In additional embodiments, methods can include Approach 1) laterally patterned ion implantation and annealing processes to impart a laterally doped region and Approach 2) laterally patterned selective areas for etch and epitaxy regrowth. These approaches can in some embodiments be limited by thermal stability of a GaN surface during the elevated temperature treatment for activation of dopants (Approach 1) and the potential for leakage paths through dislocations and stacking faults related to the competitive growth from the sidewall and the trench bottom, local defects such as nitrogen vacancies introduced by selective etching processes prior to regrowth, introduction of impurities such as high density silicon, at the regrown PN junction interface, and difficulty in achieving conformal epitaxy on the sidewall of etched trenches with given geometry (Approach 2).

Process Description

FIGS. 1a-h show an embodiment of a process flow of forming a lateral PN junction. In FIG. 1a, a doped Group III-Group V semiconductor, such as an n–GaN drift layer 14 is located on a Group III-Group V substrate, such as a GaN substrate 12. Any suitable method for fabricating the n–GaN drift layer can be used, such as metal organic chemical vapor deposition (MOCVD), molecular beam epitaxy (MBE) or hydride vapor phase epitaxy (HVPE). In various embodiments, the dopant for the n–GaN layer can be any suitable atom, such as Si, Ge or O, and can have a level such as $1\times10^{10}/cm^3$ to $1\times10^{20}/cm^3$. Other semiconductor materials, such as Group III-Group V semiconductors can be used to form the drift layer 14, but drift layer 14 will be referred to herein as n–GaN drift layer for convenience, while a person of skill in the art would understand that different materials, such as other Group III-Group V semiconductors (such as those described herein) can be appropriately doped and used in various embodiments as well and the n and p doping can be reversed between the layers as desired.

Figure 1B:
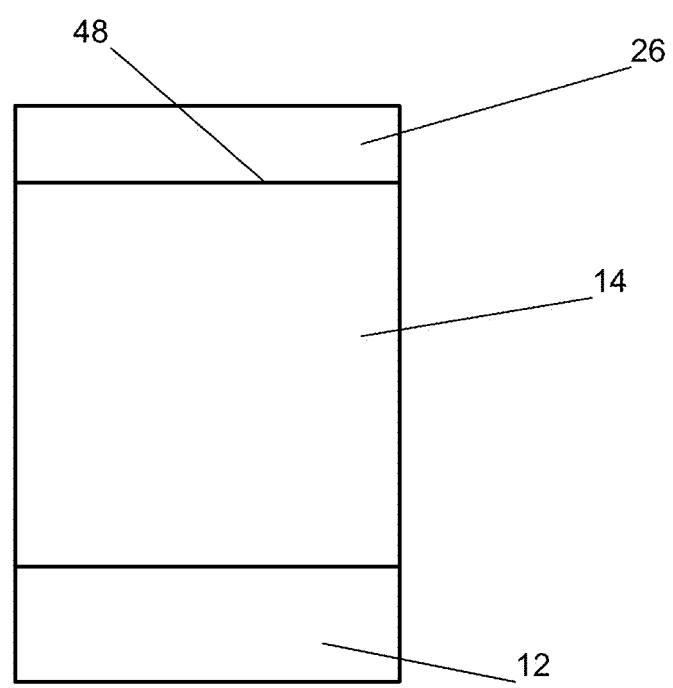

FIG. 1b shows a dielectric layer 26 deposited on an upper surface 48 of the n–GaN drift layer 14. Here, the dielectric layer can be deposited on the entire upper surface 48 of the n–GaN drift layer 14 on the GaN substrate 12. Any suitable method for depositing the dielectric layer 26, such as atomic layer deposition, metal-organic chemical vapor deposition, plasma-enhanced chemical vapor deposition, low-temperature chemical vapor deposition, can be used. The dielectric material can be $SiO_2$, SiN or any other suitable dielectric that can provide the desired characteristics of masking and/or electrical insulation.

Figure 1C:
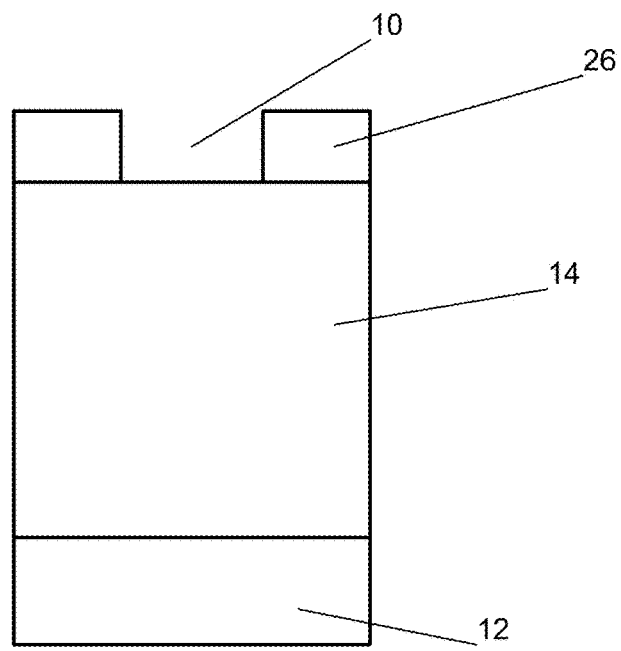
Figure 1D:
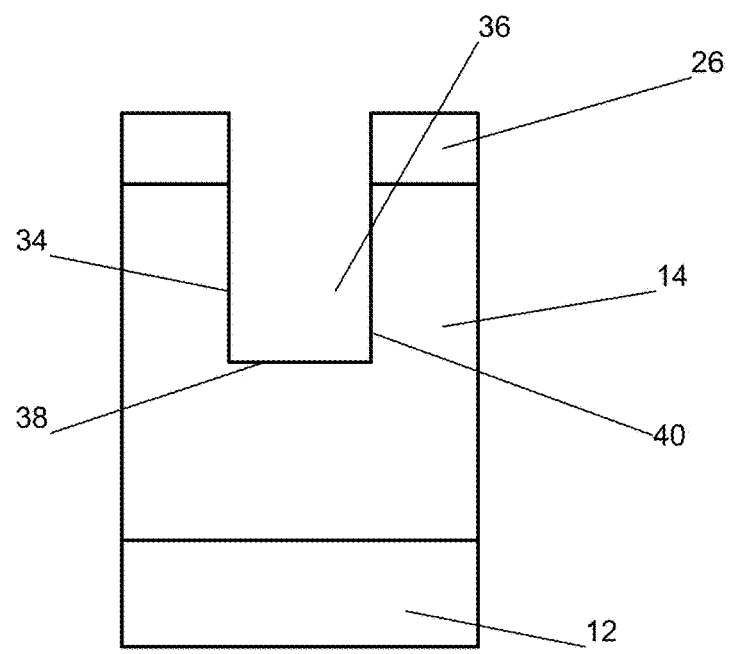

FIG. 1c shows the wafer after it has been patterned and selective areas of the dielectric have been removed to form a patterned opening 10 in the dielectric. Suitable methods of patterning and material removal include methods such as wet etch or plasma-based dry etch. In some embodiments, the material removal that occurs for FIG. 1c can also progress into the n–GaN material 14 to at least some extent. After the patterned opening 10 is formed, a trench 36 can be formed in n–GaN drift layer 14, such as by using dielectric layer 26 on the upper horizontal surface 48 of the n–GaN drift layer 14 as the etch mask. The device after forming the trench 36 is shown in FIG. 1d. Suitable methods for forming the trench 36 can include methods of dry etching, such as Cl-based plasma etch.

Figure 2:
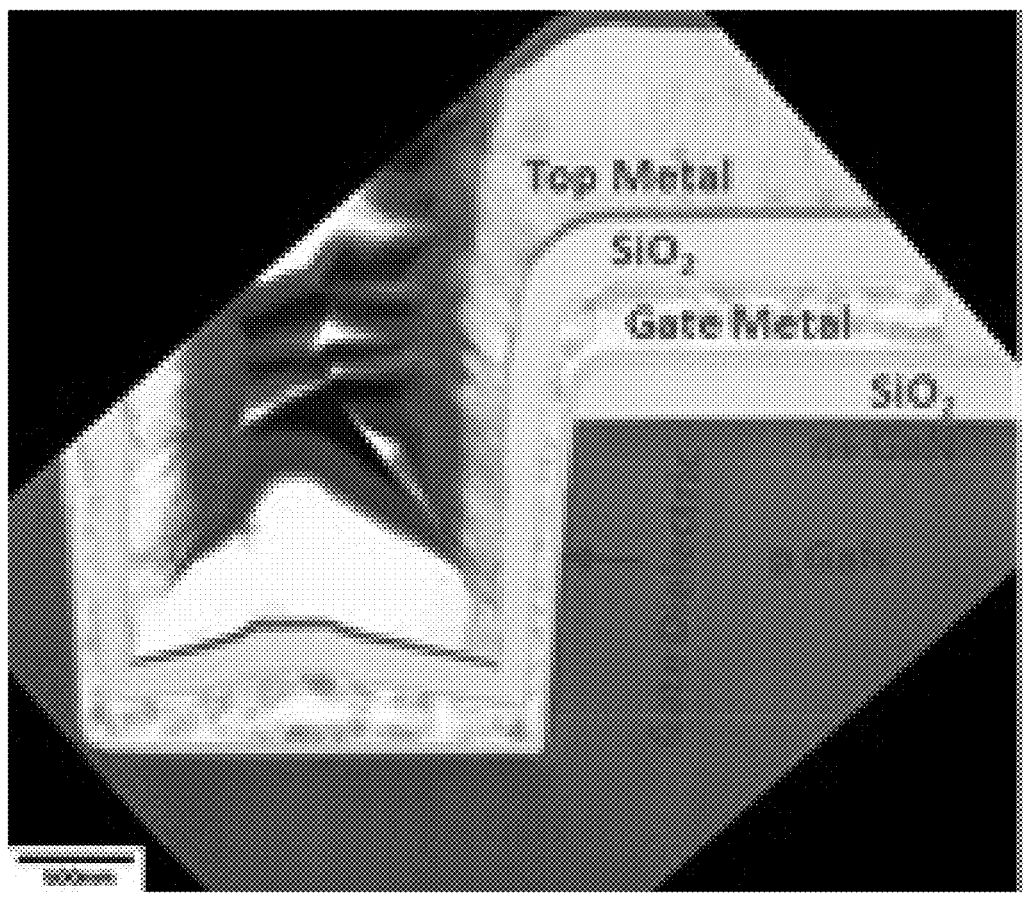
FIG. 2 shows an scanning electron micrograph (SEM) of an embodiment of a device at one processing step.

In some embodiments, it can be beneficial to use a dry etch process with processing conditions selected, such as by varying the power input and/or by varying the vapor composition and pressure, such as the vapor pressure of chlorine species, to reduce or eliminate the occurrence of (1) grass formation (such as due to micro-masking); (2) micro-trenching at the corners of the trenches; and/or (3) surface roughness on the etched sidewall. An example of a dry-etched trench is shown in FIG. 2. The trench in FIG. 2 was made by dry etching of GaN using dielectric as the etch mask.

Figure 1E:
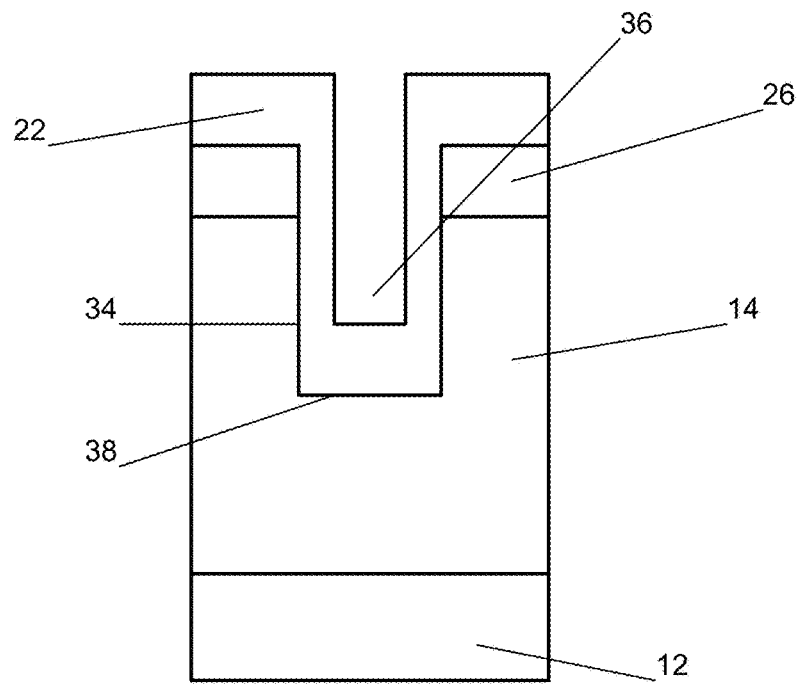
Figure 1F:
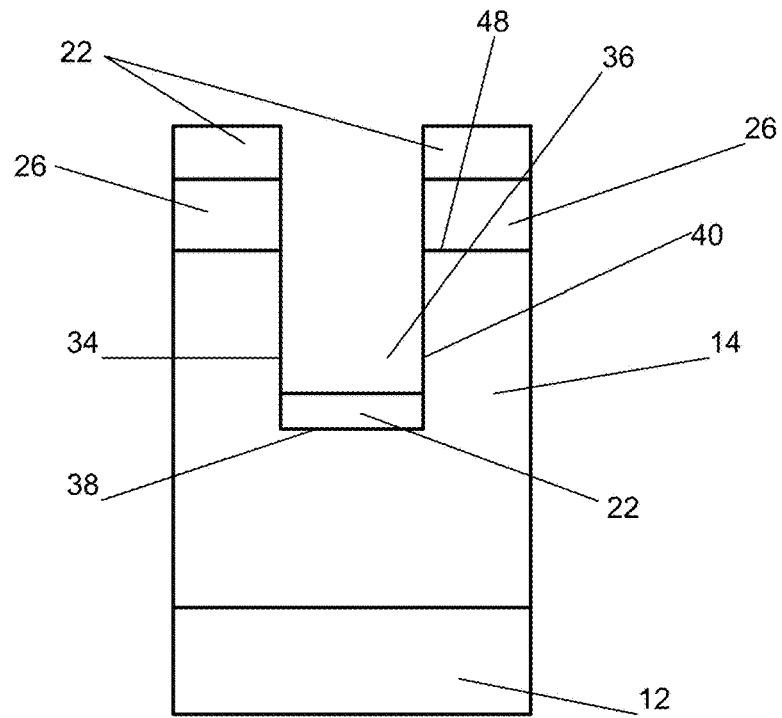

After trench formation, in one embodiment, some or all of the horizontal surfaces (such as the surfaces that are the c-plane of the n–GaN 14) can be masked while some or all of the vertical surfaces (such as the surfaces that are the m-plane of the n–GaN 14) are exposed. In one embodiment, another layer of dielectric can be deposited over the wafer, preferably using an anisotropic physical-vapor-deposition process, such as e-beam evaporation. (FIG. 1e.) In a preferred embodiment, the anisotropic deposition can result in less deposition on the trench sidewalls as compared with the planar surface, providing a thicker layer of dielectric on horizontal surfaces than on vertical surfaces. After the second dielectric deposition, an isotropic etch (such as wet etch, high pressure plasma etch or a buffered oxide etch (such as an HF dip)) can be performed to remove dielectric from the trench sidewalls 34, 40, with dielectric remaining on the horizontal surfaces such as one or more of the trench bottom 38 and the upper horizontal surface 48, as in FIG. 1f. In some embodiments, a dielectric layer 22 can remain covering the bottom of the trench 38 and the upper horizontal surface 48 of the n–GaN drift layer, and the dielectric material can be removed completely from the trench sidewalls 34, 40 (except where the edge of the dielectric layer 22 covering the bottom of the trench 38 contacts the sidewalls 34, 40.)

Figure 1G:
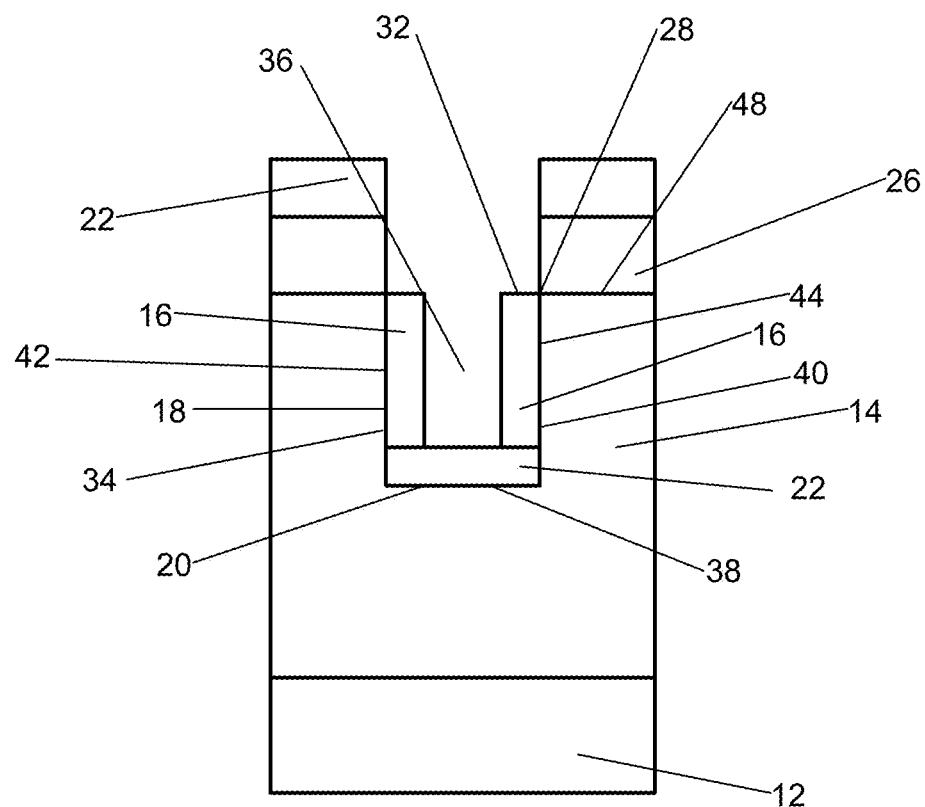
Figure 3:
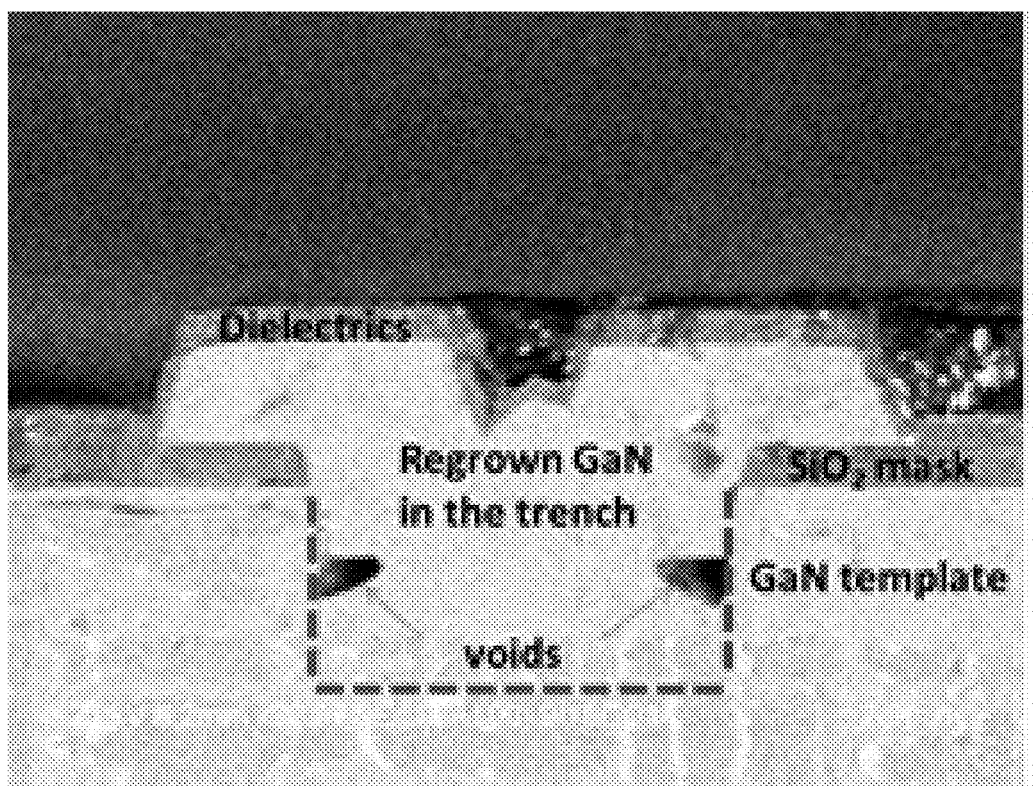
FIG. 3 shows an SEM of an embodiment of a device at one processing step.

Next p–GaN 16 can be regrown on the trench sidewall(s) 34, 40, forming PN junctions 42, 44 with the exposed n–GaN of the sidewalls 34, 40, as shown in FIG. 1g. Suitable methods for regrowth of p–GaN can include metalorganic chemical vapor deposition. In preferable embodiments, regrowth of the p–GaN material will result in regrown p–GaN material with low or zero incidence of voids. FIG. 3 is a scanning electron micrograph of a cross-section of GaN regrown in a 1.5 µm-deep trench (the outline of the original trench is indicated by dashed lines) where the bottom of the trench was not covered with dielectric during the regrowth step. The regrown GaN filled the trench and overgrew on top of the $SiO_2$ mask and was covered by another layer of dielectric grown by metal-organic chemical vapor deposition (MOCVD.) Also visible are two voids that formed in the trench during the regrowth. Without wishing to be limited by theory, it is believed that the voids occurred as a result of the competition between the vertical GaN growth from the trench bottom and the lateral GaN growth from the upper portion of the trench sidewalls.

Again, without wishing to be limited by theory, it is believed a conformal growth on the sidewall would be beneficial in avoiding formation of voids, although some degree of non-conformity can be tolerated for at least some applications. It is also believed that increases in trench depth and/or increases in aspect ratio can increase the difficulty in achieving conformal growth and conformal growth with low or non-occurrence of voids/defects. In some particular embodiments, such as where trench depth approaches or exceeds about 0.1 to about 10 μm, and/or where the width is or exceeds about 0.1 to about 10 μm, conformal growth can be particularly difficult to achieve, due to both group III and group V atoms requiring kinetic energy high enough (higher temperature) to move freely on the sidewall. Conditions favoring conformal growth for trench depths up to about 1, 2, 3, 4, 5, 6, 7 or 8 μm or more and/or where the width is or exceeds about 0.1 to about 10 μm can include lower pressures, higher temperatures and higher V/III ratio, and the presence of a dielectric layer on or covering portions of or the entirety of the trench bottom can allow greater flexibility in selecting process conditions and can simplify achieving conformal sidewall growth and conformal sidewall growth with reduced incidence of defects.

Figures 4A, 4B, 4C:
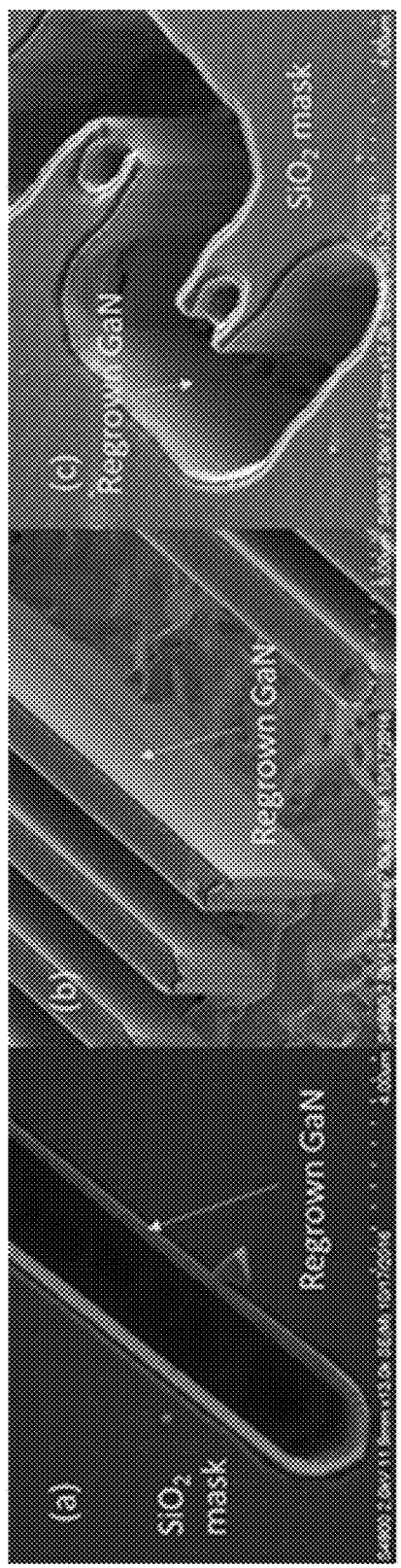
FIG. 4a-c show SEMs of a embodiments of a device at a particular processing step.

FIG. 4a-c shows SEMs of GaN regrown on the sidewalls of 4 μm deep trenches (FIGS. 4a and c) and 4 μm tall fins (FIG. 4b). To prepare the specimens of FIGS. 4a-c, n+GaN substrates were patterned with SiO$_2$ masks. After dry etching (e.g. plasma etch, such as reactive ion etch or inductively coupled plasma techniques), only GaN sidewalls and the trench bottom were exposed to regrowth. In this experiment, the planar region at the bottom of the vertical structure (such as the trench bottom) was not covered by a dielectric mask. In some embodiments, the regrowth can favor or be limited to the sidewalls in preference to the planar bottom region (e.g. trench bottom) by selection of the aspect ratio of the trench and the regrowth conditions. For deep trenches, such as where the aspect ratio (depth/width) is greater than or equal to about 2, the regrowth conditions can be controlled to such that the regrowth occurs primarily or exclusively on the sidewalls rather than the bottom. Without wishing to be limited by theory, it is believed that the vapor species that diffuse into the trench are consumed before in regrowth on the sidewalls before they can reach the bottom. In some such embodiments, the sidewall regrowth can be conformal, near conformal or non-conformal, such as where the regrowth at the top of the trench is greater than that further down in the trench. While in some applications, this non-conformality can be undesirable, in some applications the degree of non-conformality can be acceptable. In this experiment, the trench bottom (or lateral region adjacent a vertical feature) was rough due to non-ideal etching. Conformal undoped GaN regrowth on sidewalls with all lateral orientations was achieved for all three samples. The growth conditions consist of low pressure, high temperature and high V/III ratio. FIG. 4a shows the top view of a trench after sidewall regrowth. FIG. 4b shows regrowth on sidewalls of fin patterns. The regrown layer in FIG. 4c shows the regrowth can be performed on non-polar planes with any orientation. Regrowth on non-polar planes with any orientation allows the fabrication of unconstrained placement on an m-plane or a p-plane of lateral PN junction diodes on a device.

Figure 5:
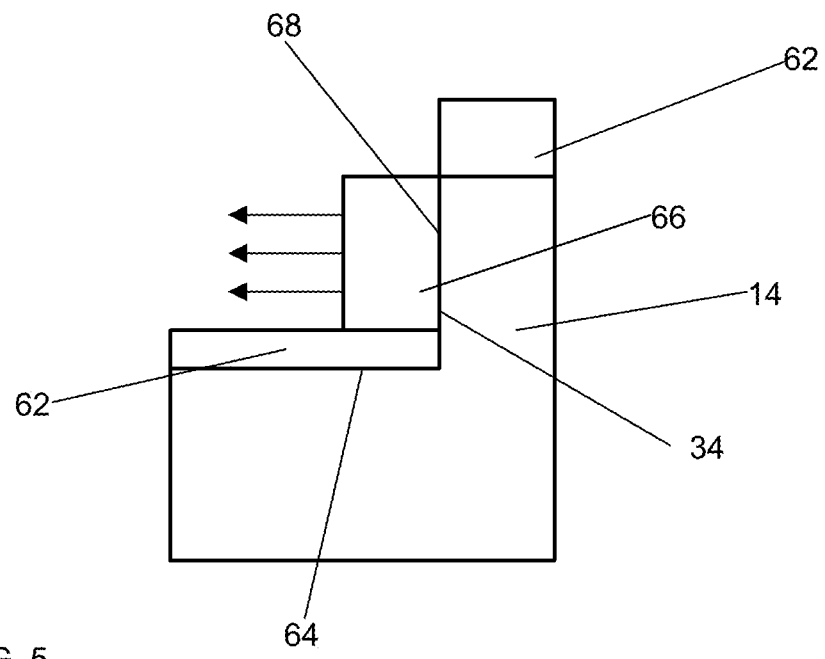
FIG. 5 is a diagram of an embodiment disclosed herein.

Conformal sidewall regrowth techniques disclosed herein can be implemented either with or without a barrier of dielectric material on the adjacent horizontal surface (such as a trench bottom with regrowth on a trench sidewall, or where the sidewall regrowth is on a stepped area of a device or chip.) For embodiments where a barrier of dielectric material is present, the presence of the barrier of dielectric material can further enhance lateral regrowth such as by reducing or eliminating the possibility of voids and other structural defects being formed during regrowth and by electrically isolating the bottom of the regrown material from the horizontal surface. A barrier of dielectric can be achieved by covering the trench bottom (or the horizontal surface adjacent to a step in the surface of the device) with an SiO$_2$ mask and performing lateral regrowth along the SiO$_2$ mask, as shown in FIG. 5. As shown in FIG. 5, no GaN growth on c-plane 64 occurs (direction of GaN growth/regrowth is in the direction of the arrows). All the regrown GaN 66 originates from the non-polar plane 68 on the sidewall 34. These conformal sidewall regrowth techniques can in various embodiments be utilized in the fabrication of a vertical diode and a vertical transistor, including those with a lateral PN junction.

Vertical Diode

Figure 6:
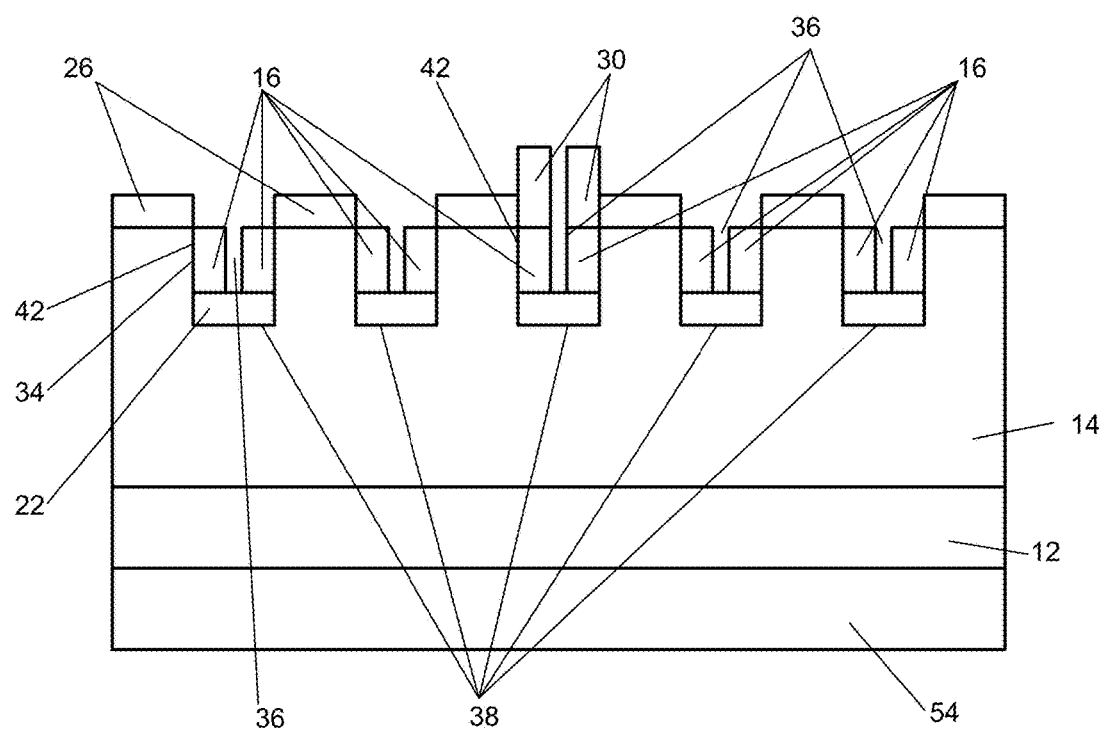
FIG. 6 is a diagram of an embodiment of a vertical diode.
Figure 7:
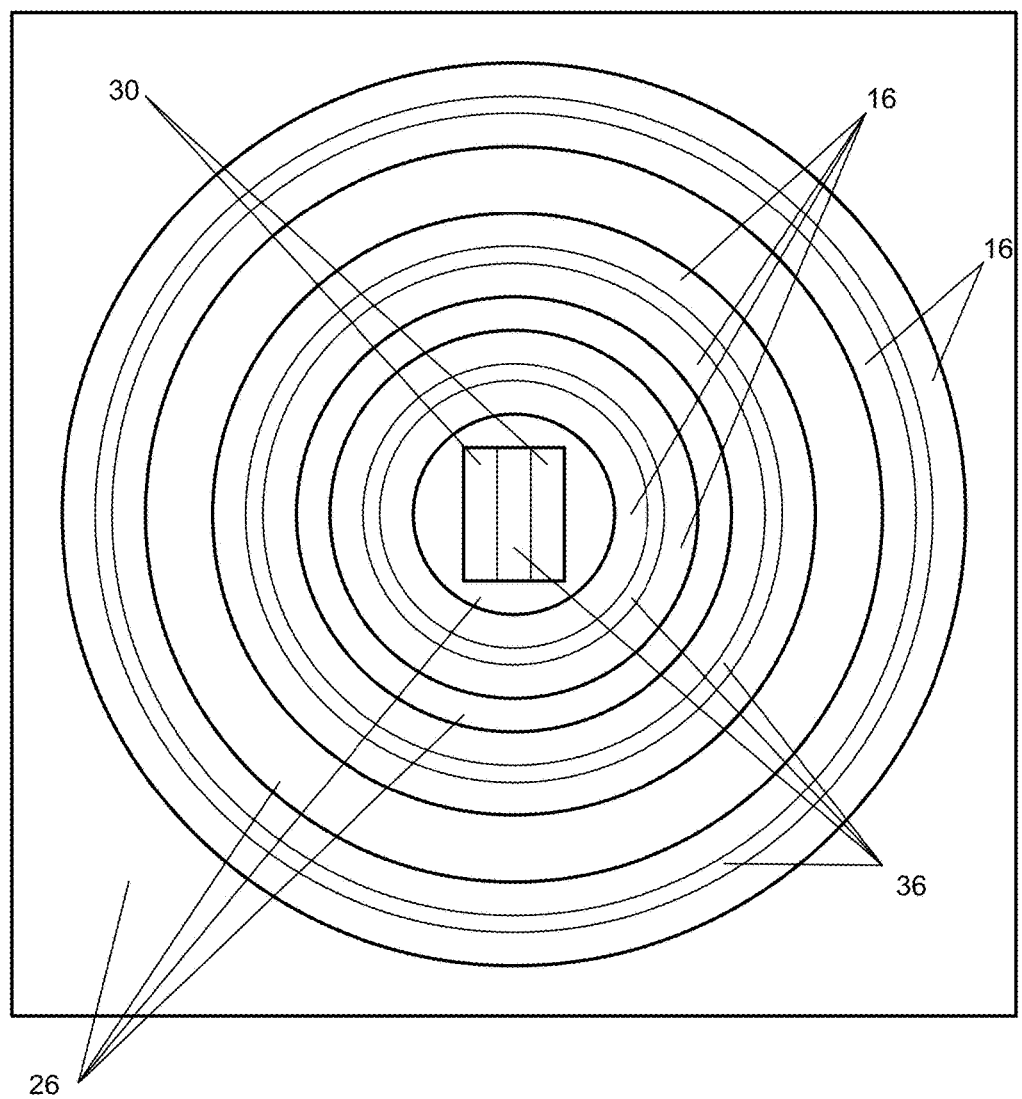
FIG. 7 is a diagram of a plan view of an embodiment of a vertical diode.

Power PN diodes can be fabricated utilizing techniques disclosed herein for the fabrication of lateral PN junctions. FIG. 6 shows a cross-sectional of a schematic of one embodiment of a lateral PN junction. FIG. 7 shows a plan view of the lateral diode of FIG. 6. In FIG. 6, a PN junction 54 is located under and in contact with an n+GaN substrate 12. On the n+GaN substrate 12 is an n–GaN drift layer 14, with a series of trenches 36 fabricated into the n–GaN drift layer 14. Within each of the trenches 36 are a dielectric layer 22 at the bottom of the trench 38 and p–GaN material 16 on the sidewalls 34 of the trench resulting in a PN junction at the sidewall. On the top of the n–GaN drift layer 14 is dielectric layer 26. The lateral PN junctions 42 shown in FIG. 6 can be used for two purposes in this device structure. One is for forming a main junction in the center trench 36 (with p-ohmic contacts 30) to provide forward conduction and reverse blocking; the other is for forming guard rings at the edge of the device to provide edge termination (trenches 36 without p-ohmic contacts 30). The geometric parameters, e.g. junction depth of the PN diode and guard ring spacing, number of guard rings, trench dimensions, etc., can be adjusted to vary the device performance.

n–GaN Material

Various grades of n–GaN material can be used in devices disclosed herein. However, in some embodiments, it can be preferable to utilize higher quality GaN drift layer material, such as those having a defect density of less than about $1\times10^{16}/cm^3$ and/or a dislocation density of less than about $1\times10^{8}/cm^2$. Suitable GaN drift layer material can in various embodiment be grown by any suitable method such as by metalorganic chemical vapor deposition, however other methods can also be used in various embodiments. In some embodiments, higher or lower quality GaN drift layer material can be used, such as where the defect density is less than about $1\times10^{20}/cm^3$, or about $1\times10^{18}/cm^3$, or about $1\times10^{17}/cm^3$, or about $1\times10^{15}/cm^3$, or about $1\times10^{14}/cm^3$ and or the dislocation density of less than about $1\times10^{10}/cm^2$, $1\times10^{9}/cm^2$, $1\times10^{7}/cm^2$, $1\times10^{6}/cm^2$, $1\times10^{5}/cm^2$ where the defect density and the dislocation density are chosen separately. In some embodiments, the quality of the GaN drift layer can be selected based upon the voltage class of the device desired, such as with higher quality GaN drift layer material (lower defect density and/or lower dislocation density) for higher voltage devices.

PN Diodes

PN diodes can benefit from utilization of lateral PN junctions, such as those disclosed herein, as well as the quality of the GaN drift layer (e.g., GaN drift layer having very low density of structure defects and impurities); edge termination suitable for preventing premature breakdown at the edge of the device; and lateral regrowth in narrow and deep trenches to meet the junction depth and pitch size requirements having high quality lateral regrowth where the defect density and/or impurity level are low at the regrowth interface. In some embodiments, the MOCVD growth conditions can be chosen for achieving high crystal quality, such as having defect density and/or dislocation density as described herein and low impurity density GaN drift layer, yielding 600~1200V class Schottky diodes and MOSFETs. Edge termination for GaN vertical devices in some embodiments can utilize techniques such as trench etch or implantation damage. Preferred embodiments of edge termination can utilize a guard ring structure embedded into the GaN material or the n–GaN drift layer. In some implementations, a guard ring structure can be achieved with no additional process steps or very few additional process steps, and can be scaled to high voltages. As disclosed herein, doped GaN sidewall growth can be achieved deep and/or narrow trenches.

In various embodiments, a vertical wall or a trench or a series of trenches can be formed in GaN or other Group III-Group V material for the preparation of PN junctions and diodes as described herein, such as where the vertical wall or the sides of the trenches follow planes of the crystal structure of the material. In some embodiments, a trench can be open-ended at one or both ends. In some embodiments, the trench can be closed at one or both ends. In some embodiments, one or both closed ends can be concave or convex in reference to the trench. In some embodiments, a series of vertical walls can form series of trenches, where at least some of the ends of the walls are not connected to other walls (such as in FIG. 4b). In some embodiments, then ends of wall can follow the hexagonal shape of a wurtzite crystal form and/or can be convex or concave in relation to the wall. In some embodiments, both ends of a trench can be closed such that the sides and ends form a hexagonal structure, such as by following the planes of the crystal, such as a hexagonal wurtzite structure. In some embodiments, one end of a trench can be open and the other end can be closed, where the closed end follows two planes of a hexagonal wurtzite structure and the sides of the trench follow two other planes of a hexagonal wurtzite structure. In various embodiments, various benefits can be achieved through selection of the shape of the trench and by selection of the crystal planes used for the device, such as one or more of high packing density, low specific on-resistance, exposure of only one crystal plane (limiting the exposure of either the m-plane or the a-plane during sidewall regrowth is possible and can simplify the selection of growth conditions.) In some embodiments of a closed trench, the side walls and the closed ends can form a regular hexagon having sides of equivalent or near equivalent lengths. In some embodiments, a vertical wall or a wall in a trench can be used which follows one crystal plane only or where a vertical wall or a wall in a trench one crystal plane followed by following one or more different crystal planes intersecting the first, such as to form one or more turns or bends in the vertical wall or a wall in the trench. In some such embodiments involving a trench, the second wall of the trench can follow a parallel path of the first wall for a portion of the trench length or for the entirety of the trench length.

In various embodiments of the devices and methods described herein, it can be beneficial to polish surfaces prior to regrowth. Polishing can result in better purity and in better quality devices, such as those that can handle higher voltage. Preferred methods of polishing can include polishing utilizing a chloride precursor (e.g. HCl, $Cl_2$, $BCl_3$, etc.) In some further preferred embodiments, polishing can be followed by commencing regrowth without exposing the polished surface to the outside atmosphere or completely eliminating the vacuum. In some such preferred embodiments, during the entire period of polish through regrowth, the material is kept under vacuum in a controlled atmosphere and the time lag between polishing and beginning regrowth is less than 30 minutes, or less than 20 minutes or less than 10 minutes or less than 5 minutes. In some embodiments, it can be beneficial to include cracked ammonia or another nitrogen source during the polishing step or a portion of the polishing step and/or during at least a portion of the regrowth step, such as to remove or suppress the formation of nitrogen vacancies ("VN") and/or assist in growing a layer of VN-free undoped GaN. In some embodiments, the polishing step can remove several of the top monolayers of GaN (or other Group III-Group V material), such as the top tens of monolayers (e.g. 10-20, 20-30, 30-40, 40-50 or more monolayers.) In some embodiments, the polishing step can reduce silicon impurity concentration below $10^{14}$ $cm^{-2}$ or below $10^{13}$ $cm^{-2}$ or below $10^{12}$ $cm^{-2}$ or lower at the regrown interface.

Modifications, additions, or omissions may be made to the systems, apparatuses, and methods described herein without departing from the scope of the inventive concepts. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A method of fabricating a lateral PN junction, the method comprising:
    conformally growing p–GaN material on a n–GaN vertical surface extending vertically from an n–GaN horizontal surface on an n–GaN drift layer to form a first PN junction,
    wherein the n–GaN horizontal surface extends horizontally from the n–GaN vertical surface and the n–GaN horizontal surface has a layer of dielectric material formed on the n–GaN horizontal surface that extends from the p–GaN surface.

2. The method of claim 1, wherein the n–GaN vertical surface is a non-polar plane of GaN.

3. The method of claim 1, wherein the n–GaN horizontal surface contacts the layer of dielectric material, and the n–GaN horizontal surface comprises a c-plane of GaN.

4. The method of claim 1, wherein the layer of dielectric material is formed by anisotropic deposition of dielectric material on the n–GaN horizontal surface resulting in a thicker layer of dielectric present on the n–GaN horizontal surface than a layer of dielectric present on the n–GaN vertical surface, followed by isotropic removal of a portion of the dielectric material resulting in the layer of dielectric formed on the n–GaN horizontal surface remaining.

5. The method of claim 1, wherein the n–GaN vertical surface is substantially free of dielectric material after the isotropic removal of dielectric material.

6. The method of claim 4, wherein an upper dielectric layer extends horizontally from an upper edge of the n–GaN vertical surface away from a direction of growth of the p–GaN material.

7. The method of claim 6, wherein an n+GaN substrate is located below the n–GaN drift layer and an n-ohmic contact is located below the n+GaN substrate, and further comprising forming a p-ohmic contact on an upper surface of the p-GaN material.

8. The method of claim 1, wherein the n-GaN vertical surface is a first sidewall of a trench formed in an n-GaN drift layer and the n-GaN horizontal surface forms the bottom of the trench.

9. The method of claim 8, wherein the trench further comprises a second sidewall opposing the first sidewall with the layer of dielectric material extending from the first sidewall to the second sidewall, and the method further comprising conformally growing p-GaN material on the second sidewall to form a second PN junction, the second PN junction extending toward the first PN junction.

10. A method of fabricating a lateral PN junction, the method comprising:
    isotropically depositing a first layer of dielectric material on a n-GaN drift layer;
    patterning and etching the n-GaN drift layer to form a trench through the first layer of dielectric material and into the n-GaN drift layer, wherein the trench comprises a bottom surface and a first sidewall;
    anisotropically depositing a second layer of dielectric material on the bottom surface of the trench and on the first layer of dielectric material;
    isotropically etching the trench resulting in n-GaN drift layer having remaining first layer and second layer of dielectric material on an upper horizontal surface of the n-GaN drift layer and remaining second layer of dielectric material on the bottom surface of the trench and the first sidewall having exposed n-GaN material;
    conformally regrowing p-GaN material on the exposed n-GaN material of the first sidewall.

11. A semiconductor comprising a lateral PN junction, the semiconductor comprising:
    an n-GaN horizontal surface;
    an n-GaN vertical surface extending vertically from the n-GaN horizontal surface;
    a dielectric layer deposited on the n-GaN horizontal surface and contacting the n-GaN vertical surface; and
    a p-GaN layer extending horizontally from the n-GaN vertical surface to form a first PN junction therewith.

12. The semiconductor of claim 11, wherein the n-GaN vertical surface is a non-polar plane of GaN.

13. The semiconductor of claim 11, wherein the n-GaN horizontal surface comprises a c-plane of GaN.

14. The semiconductor of claim 11, further comprising:
    a second n-GaN vertical surface extending vertically from the n-GaN horizontal surface and facing the n-GaN vertical surface;
    a second p-GaN layer extending horizontally from the second n-GaN vertical surface toward the n-GaN vertical surface, the second p-GaN layer and the second n-GaN vertical surface forming a second PN junction.

* * * * *